(12) United States Patent
Kim et al.

(10) Patent No.: US 8,222,129 B2
(45) Date of Patent: Jul. 17, 2012

(54) METHOD FOR MANUFACTURING SOLAR CELL

(75) Inventors: Young Su Kim, Seoul (KR); Doo-Youl Lee, Seoul (KR)

(73) Assignees: Samsung Electronics Co., Ltd., Suwon-si, Gyeonggi-do (KR); Samsung SDI Co., Ltd., Yongin-si, Gyeonggi-do (KR)

( * ) Notice: Subject to any disclaimer, the term of this patent is extended or adjusted under 35 U.S.C. 154(b) by 49 days.

(21) Appl. No.: 12/893,944

(22) Filed: Sep. 29, 2010

(65) Prior Publication Data

US 2011/0306164 A1    Dec. 15, 2011

(30) Foreign Application Priority Data

Jun. 11, 2010    (KR) ................. 10-2010-0055435

(51) Int. Cl.
*H01L 21/00* (2006.01)
*H01L 21/22* (2006.01)
(52) U.S. Cl. .......... 438/542; 438/69; 438/514; 438/559; 257/E27.124; 257/E27.125; 257/E25.007
(58) Field of Classification Search ............ 438/69, 438/514, 542, 559; 257/E27.124, E27.125, 257/E25.007
See application file for complete search history.

(56) References Cited

U.S. PATENT DOCUMENTS

| 4,156,309 | A | * | 5/1979 | Routh et al. ............ 438/80 |
| 4,927,770 | A | | 5/1990 | Swanson |
| 5,053,083 | A | | 10/1991 | Sinton |
| 6,998,288 | B1 | | 2/2006 | Smith et al. |
| 2008/0289683 | A1 | * | 11/2008 | Walsh et al. ........... 136/255 |

\* cited by examiner

*Primary Examiner* — Michelle Mandala
(74) *Attorney, Agent, or Firm* — Lee & Morse, P.C.

(57) ABSTRACT

A method for manufacturing a solar cell according to an exemplary embodiment includes: forming a first doping film on a substrate; patterning the first doping film so as to form a first doping film pattern and so as to expose a portion of the substrate; forming a diffusion prevention film on the first doping film pattern so as to cover the exposed portion of the substrate; etching the diffusion prevention film so as to form spacers on lateral surfaces of the first doping film pattern; forming a second doping film on the first doping film pattern so as to cover the spacer and exposed substrate; forming a first doping region on the substrate surface by diffusing an impurity from the first doping film pattern into the substrate; and forming a second doping region on the substrate surface by diffusing an impurity from the second doping film pattern into the substrate.

16 Claims, 7 Drawing Sheets

METHOD FOR MANUFACTURING SOLAR CELL

CROSS-REFERENCE TO RELATED APPLICATION

This application claims priority to, and the benefit of, Korean Patent Application No. 10-2010-0055435 filed in the Korean Intellectual Property Office on Jun. 11, 2010, the entire contents of which are incorporated herein by reference.

BACKGROUND OF THE INVENTION (a) Field of the Invention

The present invention relates generally to solar cells. More specifically, the present invention relates to methods of manufacturing solar cells.

(b) Description of the Related Art

A solar cell is a device that converts solar light energy into electrical energy by using a photoelectric effect.

Solar cells have recently found applications as clean energy or next-generation energy that can replace or reduce dependence on less desirable energy sources, such as fossil fuels or atomic energy.

Solar cells that use silicon as a light absorption layer may be classified into crystalline substrate (Wafer) type solar cells and thin film type (amorphous, polycrystalline) solar cells.

Other representative types of solar cells include compound thin film solar cells that use CIGS (CuInGaSe2) or CdTe, Group III-V solar cells, dye sensitive solar cells, and organic solar cells.

The basic structure of a typical solar cell employs a P type semiconductor and an N type semiconductor in a conjunction structure, similar to a diode. If light is incident in the solar cell, electrons having a (−) charge and holes that have a (+) charge caused by the removal of the electrons are generated by interaction of light with the material that constitutes the semiconductor of the solar cell, generating an current when the electrons and holes move.

This phenomenon is referred to as the photovoltaic effect. Once the electrons and holes are generated, the electrons are drawn to the n type semiconductor and the holes are drawn to the p type semiconductor. This flow of electrons/holes generates an electrical current.

In a back contact solar cell, the P type semiconductor, N type semiconductor, and any metal grids connected thereto are all disposed in the rear of the solar cell.

U.S. Pat. No. 6,998,288 discloses that the fabrication of back contact solar cells can be simplified by forming both an N+ region and P+ region via an atmospheric pressure chemical vapor deposition (APCVD) at the same time, reducing the manufacturing cost of the back contact solar cell.

However, this process also presents challenges. Since the N+ region and P+ region contact each other, a short occurs between the regions and a shunt resistance of the solar cell is increased, thus lowering the cell's efficiency.

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention provides a method for manufacturing a solar cell, in which a high efficiency solar cell can be manufactured without increasing the number of manufacturing processes employed.

An exemplary embodiment of the present invention provides a method for manufacturing a solar cell that includes: forming a first doping film on a substrate; patterning the first doping film so as to form a first doping film pattern and so as to expose a portion of the substrate; forming a diffusion prevention film on the first doping film pattern so as to cover the exposed portion of the substrate; etching the diffusion prevention film so as to form spacers on lateral surfaces of the first doping film pattern; forming a second doping film on the first doping film pattern so as to cover the spacer and exposed substrate; forming a first doping region on the substrate surface by diffusing an impurity from the first doping film pattern into the substrate; and forming a second doping region on the substrate surface by diffusing an impurity from the second doping film pattern into the substrate.

The method for manufacturing a solar cell may further include forming a buffer layer disposed between the first doping region and the second doping region, and the buffer layer may be formed on a portion of the substrate that corresponds to the spacer.

The method also includes forming a plurality of the first doping regions, a plurality of the second doping regions, and a plurality of the buffer layers, ones of the first doping regions disposed in alternating manner with ones of the second doping regions, wherein ones of the buffer layers are disposed therebetween.

The forming a buffer layer may further comprise forming a LDD (lightly doped drain) region. The forming a LDD region may further comprise diffusing an impurity from the first doping region into the substrate so as to form a first buffer layer, and diffusing an impurity from the second doping region into the substrate so as to form a second buffer layer.

The forming a first doping region may further comprise forming the first doping region by a heat treatment process, and the forming a second doping region may further comprise forming the second doping region by the heat treatment process.

The method for manufacturing a solar cell according to an exemplary embodiment of the present invention may further include removing the first doping film pattern, the spacer and the second doping film pattern.

The forming a first doping region and the forming a second doping region may be performed substantially simultaneously.

The diffusion prevention film may comprise a silicon oxide.

The substrate may include a front side and an opposite back side, and the first doping region and the second doping region may each be disposed on the back side of the substrate.

The method for manufacturing a solar cell according to an exemplary embodiment of the present invention may further include forming a back side electrode on the back side of the substrate, the back side electrode comprising a first electrode that is connected to the first doping region and the second electrode that is connected to the second doping region.

The substrate may be positioned so that ambient light is incident to the front side of the substrate.

The first doping film and the second doping film may comprise silicon oxides that include impurities having different conductive types.

The first doping region and the second doping region may include impurities having different conductive types.

The substrate may be an N type silicon wafer.

The spacer may be formed of a same material as that of the diffusion prevention film.

Another exemplary embodiment of the present invention provides a method for manufacturing a solar cell, which includes: forming a first doping film on a substrate; patterning the first doping film so as to form a first doping film pattern and so as to expose a portion of the substrate; forming a diffusion prevention film on the first doping film pattern so as to cover the exposed portion of the substrate; etching the diffusion prevention film so as to form spacers on lateral surfaces of the first doping film pattern; implanting ions in the substrate using the first doping film pattern and the spacer as a mask; and forming a first doping region on the substrate surface by diffusing an impurity from the first doping film pattern into the substrate. The implanting may further comprise implanting ions in the substrate so as to form a second doping region on the substrate surface, the first doping region and the second doping region disposed proximate to each other so as to form a PN conjunction.

The method for manufacturing a solar cell may further include forming a buffer layer disposed between the first doping region and the second doping region, and the buffer layer may be formed on a portion of the substrate that corresponds to the spacer.

The method may further comprise forming a plurality of the first doping regions, a plurality of the second doping regions, and a plurality of the buffer layers, ones of the first doping regions disposed in alternating manner with ones of the second doping regions, wherein ones of the buffer layers are disposed therebetween.

The forming a buffer layer may further comprise forming a LDD (lightly doped drain) region. The forming a LDD region may further comprise diffusing an impurity from the first doping region into the substrate so as to form a first buffer layer, and diffusing an impurity from the second doping region into the substrate so as to form a second buffer layer.

The method for manufacturing a solar cell according to an exemplary embodiment of the present invention may further include removing the first doping film pattern and the spacer.

The diffusion prevention film may comprise a silicon oxide.

The substrate may include a front side and an opposite back side, and the first doping region and the second doping region may each be disposed on the back side of the substrate.

The method for manufacturing a solar cell according to an exemplary embodiment of the present invention may further include forming a back side electrode on the back side of the substrate, the back side electrode comprising a first electrode that is connected to the first doping region, and a second electrode that is connected to the second doping region.

The substrate may be positioned so that ambient light is incident to the front side of the substrate.

The first doping film and the second doping film may comprise silicon oxides that include impurities having different conductive types.

The first doping region and the second doping region may include impurities having different conductive types.

The substrate may be an N type silicon wafer.

The spacer may be formed of a same material as that of the diffusion prevention film.

According to exemplary embodiments of the present invention, in the manufacturing process of the solar cell, a buffer layer that is self-arranged may be formed between doping regions via the forming of a spacer. this buffer layer helps to prevent the occurrence of shorts caused by direct contact of two doping regions that have impurities of different conductive types.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE EMBODIMENTS

Aspects of the present invention are described more fully hereinafter with reference to the accompanying drawings, in which exemplary embodiments of the invention are shown.

FIG. 1 to FIG. 7 are cross-sectional views that illustrate a manufacturing method of a solar cell according to an exemplary embodiment of the present invention.

Figure 1:
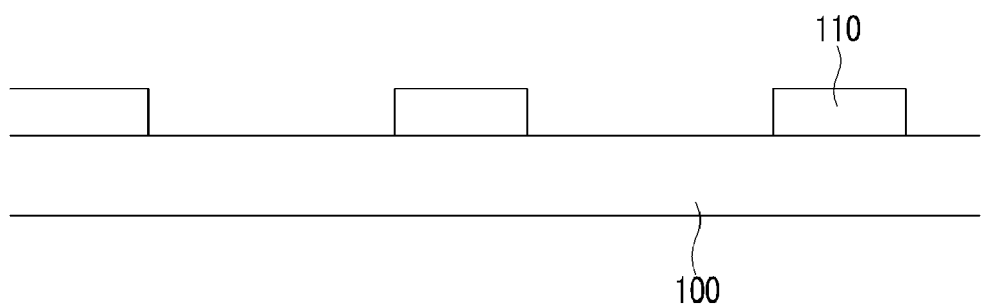
FIG. 1 to FIG. 7 are cross-sectional views that illustrate a manufacturing method of a solar cell according to an exemplary embodiment of the present invention.

With reference to FIG. 1, a first doping film is deposited on a substrate 100, and patterned to form a first doping film pattern 110.

The substrate 100 may be an N type silicon wafer. However, one of ordinary skill in the art will realize that embodiments of the invention can be implemented with a P type wafer as well.

The thickness of the first doping film pattern 110 may be in the range of approximately 500 to 20000 Å.

In addition, the first doping film pattern 110 may be formed by any suitable method, such as a screen printing method, an inkjet printing method or a photolithography method.

After the patterning, a portion of the substrate 100 is exposed.

The first doping film pattern 110 may be formed of silicon oxide into which an N type impurity is doped. The silicon oxide may be silicon dioxide ($SiO2$), while the N type impurity may be phosphorus (P), arsenic (As) or the like.

The substrate 100 includes a front side and an opposite back side. The first doping film pattern 110 is formed on the back side of the substrate 100, while the front side of the substrate 100 corresponds to a side upon which external light falls incident.

Figure 2:
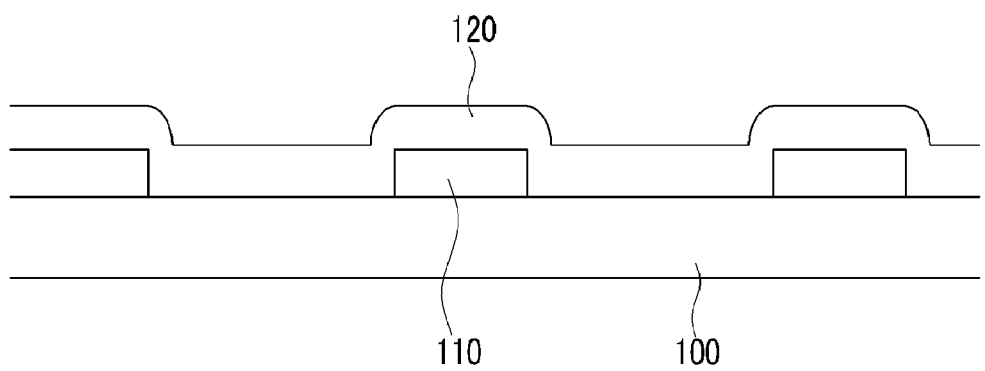

With reference to FIG. 2, the diffusion prevention film 120 is formed on the first doping film pattern 110, covering both the diffusion prevention film 120 and the exposed portions of the substrate 100.

The diffusion prevention film 120 may be formed of silicon oxide that is not doped. The thickness of the diffusion prevention film 120 may be in the range of approximately 500 to 20000 Å.

Figure 3:
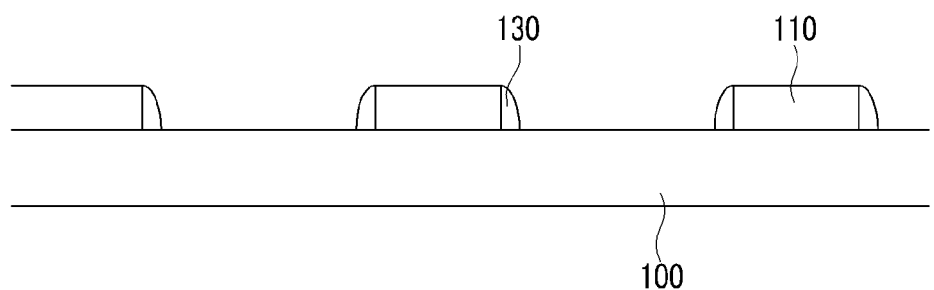

With reference to FIG. 3, a portion of the substrate 100 is exposed by blank etching the diffusion prevention film 120. This forms spacers 130 on lateral (i.e., vertical) surfaces of the first doping film pattern 110.

The blank etching method can be any suitable etching process, such as wet etching or dry etching. However, in order to form the same spacer 130 in the shape shown in FIG. 3, it is preferable that a dry etching method is used.

Figure 4:
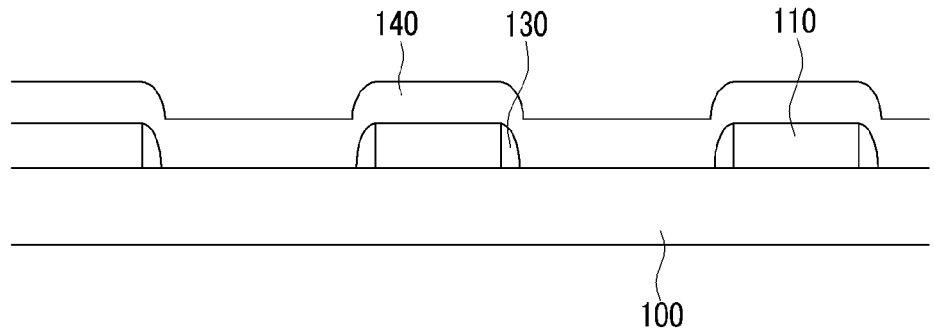

With reference to FIG. 4, a second doping film 140 is formed on the first doping film pattern 110 so as to cover the exposed portions of the spacer 130 and substrate 100.

The second doping film pattern 140 may be formed of silicon oxide into which a P type impurity is doped. The silicon oxide may be silicon dioxide ($SiO2$), while the P type impurity may be boron (B), gallium (Ga), indium (In) or the like.

Figure 5:
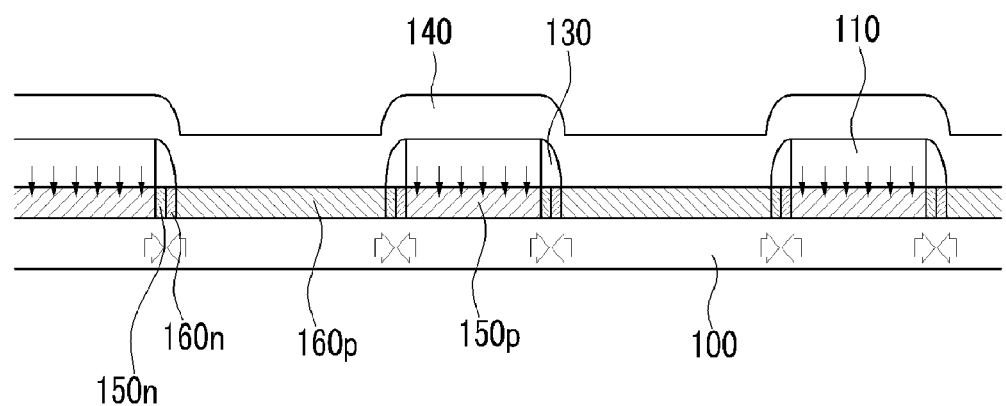

With reference to FIG. 5, a first doping region 150$p$ is formed by diffusing an impurity from the first doping film pattern 110 into the substrate 100. Here, this diffusion is accomplished by performing a heat treatment process. This heat treatment process also forms a second doping region 160p by diffusing an impurity from the second doping film 140 into the substrate 100.

The first doping region 150p and the second doping region 160p may be formed largely simultaneously, i.e. during the same heat treatment process, as above.

The heat treatment process also forms buffer layers 150n and 160n between the first doping region 150p and the second doping region 160p.

The first doping region 150p and the second doping region 160p are formed by diffusing an impurity in a generally vertical direction, into the substrate 100 from either the first doping film pattern 110 or the second doping film 140. In contrast, the self-aligned buffer layers 150n and 160n are formed by diffusing and doping an impurity in a generally lateral, or side, direction from the first doping region 150p and the second doping region 160p generally parallel to the surface of the substrate 100.

The buffer layers 150n and 160n are formed generally simultaneously with the first and second doping regions 150p, 160p, may be an LDD (lightly doped drain) region, and include first buffer layer 150n that is close to the first doping region 150p, and second buffer layer 160n that is close to the second doping region 160p.

The first buffer layer 150n may be doped with the same type impurity as the first doping region 150p, and the second buffer layer 160n may be doped with the same type impurity as the second doping region 160p.

The buffer layers 150n and 160n prevent the occurrence of shorts that can occur when the first doping region 150p directly contacts the second doping region 160p.

In the solar cell of this exemplary embodiment of the present invention, the first doping region 150p and the second doping region 160p form a PN conjunction.

Figure 6:
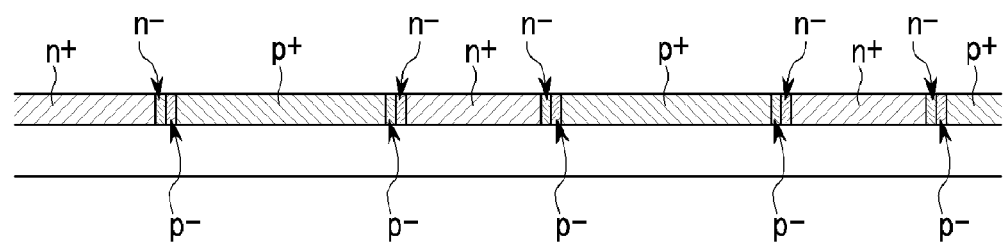

With reference to FIG. 6, the first doping film pattern 110, spacer 130 and the second doping film 140 are removed. In this case, the first doping film pattern 110, spacer 130 and the second doping film 140 may be etched by using hydrogen fluoride (HF) or another suitable etchant that has a relatively large etching selectivity with respect to the substrate 100.

As seen from FIG. 6, a number of first and second doping regions 150p, 160p can be formed in alternating manner on substrate 100, with buffer layers 150n, 160n formed inbetween.

Figure 7:
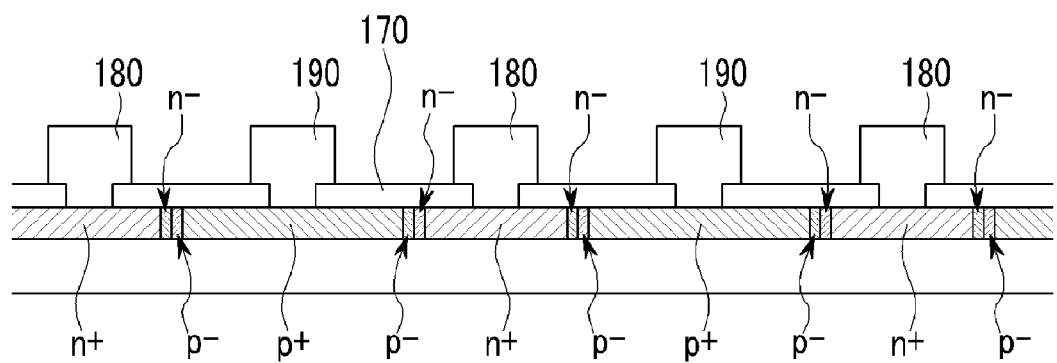

With reference to FIG. 7, an insulating layer 170 that has an opening (not shown) is formed on the first doping region 150p and the second doping region 160p. In addition, first electrodes 180 and second electrodes 190 are formed so as to be connected to the first doping regions n+ and the second doping regions p+, respectively.

FIG. 8 to FIG. 13 are cross-sectional views that illustrate a manufacturing method of a solar cell according to another exemplary embodiment of the present invention.

Figure 8:
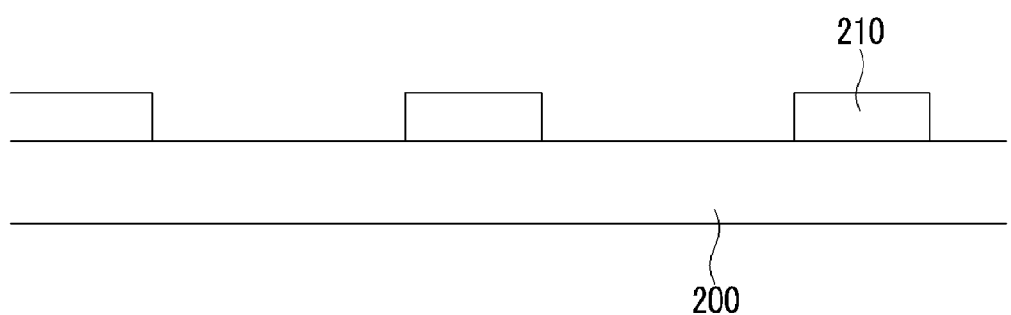
FIG. 8 to FIG. 13 are cross-sectional views that illustrate a manufacturing method of a solar cell according to another exemplary embodiment of the present invention.

With reference to FIG. 8, a first doping film is deposited on a substrate 200, and patterned to form a first doping film pattern 210.

The substrate 200 may be an N type silicon wafer. Additionally, the thickness of the first doping film pattern 210 may be in the range of approximately 500 to 20000 Å. Also, the first doping film pattern 210 may be formed by any suitable method, such as a screen printing method, an inkjet printing method or a photolithography method.

After the patterning, a portion of the substrate 200 is exposed.

The first doping film pattern 210 may be formed of silicon oxide into which an N type impurity is doped. Also, the silicon oxide may be silicon dioxide (SiO2). Additionally, the N type impurity may be phosphorus (P), arsenic (As) or the like.

The substrate 200 has a front side and an opposite back side. The first doping film pattern 210 is formed on the back side of the substrate 200, while the front side of the substrate 200 corresponds to a side upon which external light falls incident.

Figure 9:
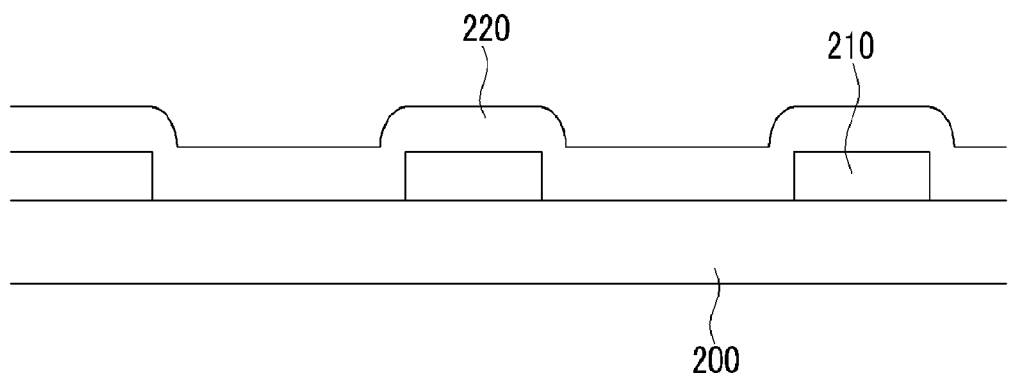

With reference to FIG. 9, a diffusion prevention film 220 is formed on the first doping film pattern 210, covering both the pattern 210 and exposed portions of the substrate 200.

The diffusion prevention film 220 may be formed of silicon oxide that is not doped. The thickness of the diffusion prevention film 220 may be in the range of about 500 to 20000 Å.

Figure 10:
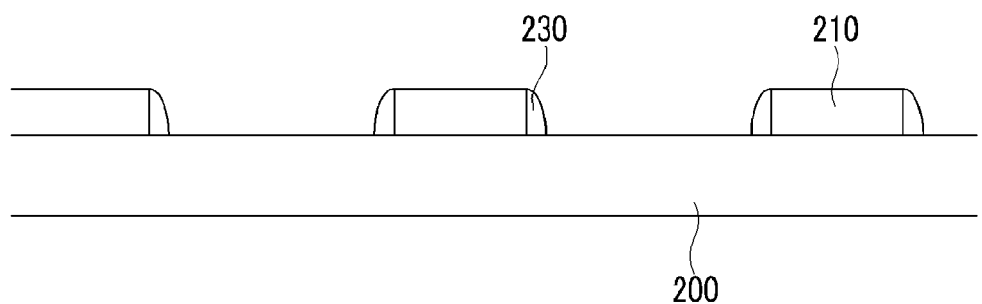

With reference to FIG. 10, a portion of the substrate 200 is exposed by blank etching the diffusion prevention film 220. In this case, a spacer 230 is formed on a lateral surface of the first doping film pattern 210.

Any suitable method may be used to etch the film 220, such as wet etching or dry etching. However, in order to form spacer 230 in the shape shown in FIG. 10, it is preferable that a dry etching method be used.

The above process is largely the same as the corresponding steps of the previous embodiment described with reference to FIG. 1 to FIG. 7.

Figure 11:
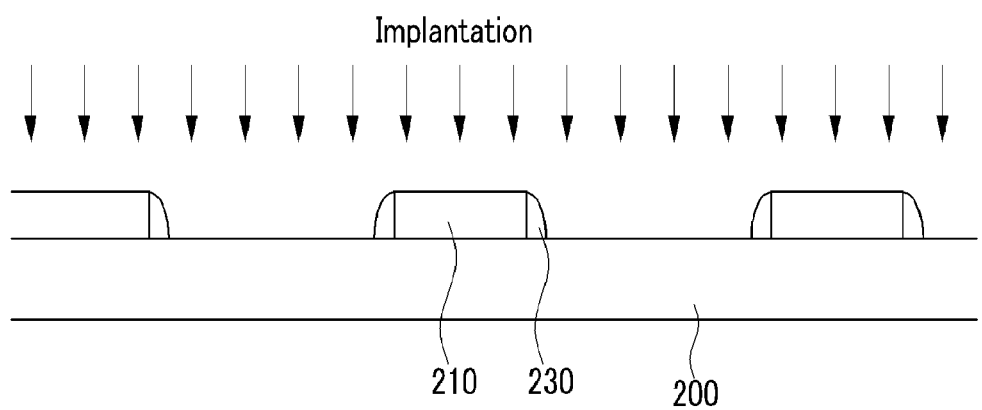

With reference to FIG. 11, an impurity ion is injected into the surface of the substrate 200 by using the first doping film pattern 210 and spacer 230 as a mask. The impurity ion may be boron (B), gallium (Ga), indium (In) or the like.

Figure 12:
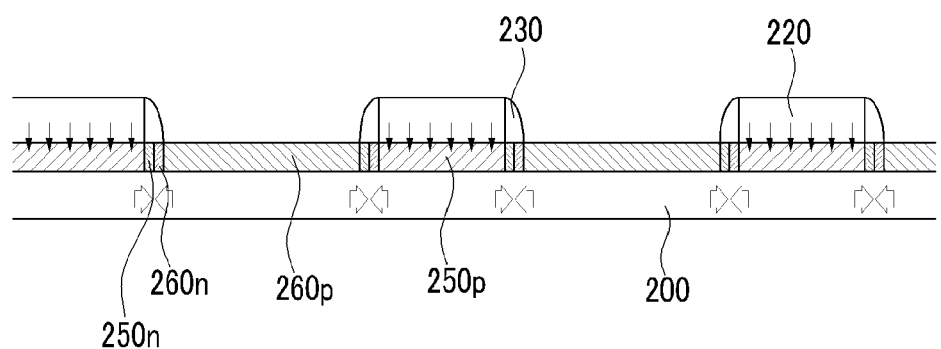

With reference to FIG. 12, the first doping region 250p is formed by diffusing the impurity from the first doping film pattern 210 into the substrate 100. As with the previous embodiment, diffusion can be accomplished by performing a heat treatment process. However, in this embodiment, the second doping region 260p is formed by activating the impurity that is injected into the substrate 200 during the heat treatment process of FIG. 11.

The buffer layers 250n and 260n are also formed between the first doping region 250p and the second doping region 260p. The first doping region 250p is formed by diffusing an impurity in a generally vertical direction, into the substrate 200 from the first doping film pattern 210, and the second doping region 160p is formed by ion injection, using the first doping film pattern 210 and the spacer 230 as a mask.

The self-aligned buffer layers 250n and 260n are formed by diffusing the impurity in a generally lateral direction from the first doping region 250p and the second doping region 260p, respectively.

The buffer layers may be an LDD (lightly doped drain) region formed generally simultaneously with the first doping regions 250p, and include first buffer layer 250n that is close to the first doping region 250p and second buffer layer 260n that is close to the second doping region 260p.

The buffer layers 250n and 260n prevent the occurrence of shorts that can occur when the first doping region 250p directly contacts the second doping region 260p.

In the solar cell of this exemplary embodiment of the present invention, the first doping region 250p and the second doping region 260p form a PN conjunction.

Figure 13:
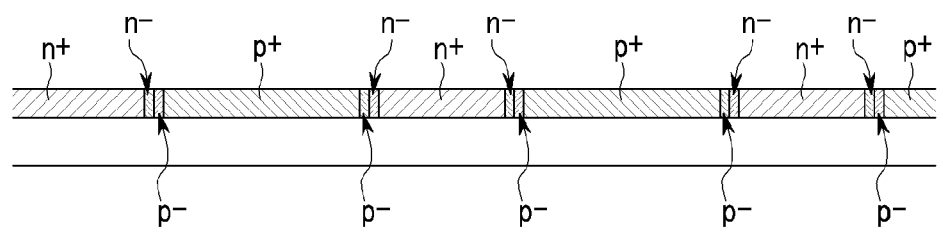

With reference to FIG. 13, the first doping film pattern 210 and spacer 230 are removed. In this case, the first doping film pattern 210 and spacer 230 may be etched by using hydrogen fluoride (HF) or another suitable etchant that has a relatively large etching selectivity with respect to the substrate 200.

As seen from FIG. 13, a number of first and second doping regions 250p, 260p can be formed in alternating manner on substrate 200, with buffer layers 250n, 260n formed inbetween.

Electrodes 180, 190 may then be formed on the first doping region 250p and the second doping region 260p, similar to FIG. 7.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of symbols>

| | |
|---|---|
| 110, 210 | First doping film pattern |
| 120, 220 | Diffusion prevention film |
| 130, 230 | Spacer |
| 140 | Second doping film |
| 150p, 250p | First doping region |
| 160p, 260p | Second doping region |
| 150n 160n | Buffer layer |
| 170 | Insulating layer |
| 180 | First electrode |
| 190 | Second electrode |

What is claimed is:

1. A method for manufacturing a solar cell, comprising:
forming a first doping film on a substrate;
patterning the first doping film so as to form a first doping film pattern and so as to expose a portion of the substrate;
forming a diffusion prevention film on the first doping film pattern so as to cover the exposed portion of the substrate;
etching the diffusion prevention film so as to form spacers on lateral surfaces of the first doping film pattern;
forming a second doping film on the first doping film pattern so as to cover the spacer and exposed substrate;
forming a first doping region on the substrate surface by diffusing an impurity from the first doping film pattern into the substrate; and
forming a second doping region on the substrate surface by diffusing an impurity from the second doping film pattern into the substrate.

2. The method of claim 1, further comprising:
forming a buffer layer disposed between the first doping region and the second doping region, wherein the buffer layer is formed on a portion of the substrate that corresponds to the spacer.

3. The method of claim 2, further comprising forming a plurality of the first doping regions, a plurality of the second doping regions, and a plurality of the buffer layers, ones of the first doping regions disposed in alternating manner with ones of the second doping regions, wherein ones of the buffer layers are disposed therebetween.

4. The method of claim 2, wherein:
the forming a buffer layer further comprises forming a LDD (lightly doped drain) region, the forming a LDD region further comprising diffusing an impurity from the first doping region into the substrate so as to form a first buffer layer, and diffusing an impurity from the second doping region into the substrate so as to form a second buffer layer.

5. The method of claim 4, wherein the diffusing an impurity from the first doping region and the diffusing an impurity from the second doping region are performed substantially simultaneously with the forming a first doping region and the forming a second doping region.

6. The method of claim 4, wherein:
the forming a first doping region further comprises forming the first doping region by a heat treatment process; and
the forming a second doping region further comprises forming the second doping region by the heat treatment process.

7. The method of claim 6 further comprising:
removing the first doping film pattern, the spacer, and the second doping film pattern.

8. The method of claim 7, wherein:
the forming a first doping region and the forming a second doping region are performed substantially simultaneously.

9. The method claim 8, wherein:
the diffusion prevention film comprises a silicon oxide.

10. The method of claim 1, wherein:
the substrate includes a front side and an opposite back side, and the first doping region and the second doping region are each disposed on the back side of the substrate.

11. The method of claim 10, further comprising:
forming a back side electrode on the back side of the substrate, the back side electrode comprising a first electrode that is connected to the first doping region, and a second electrode that is connected to the second doping region.

12. The method of claim 11, wherein:
the substrate is positioned so that ambient light is incident to the front side of the substrate.

13. The method of claim 1, wherein:
the first doping film and the second doping film comprise silicon oxides that include impurities having different conductive types.

14. The method of claim 1, wherein:
the first doping region and the second doping region include impurities having different conductive types.

15. The method of claim 1, wherein:
the substrate is an N type silicon wafer.

16. The method of claim 1, wherein:
the spacer is formed of a same material as that of the diffusion prevention film.

* * * * *